United States Patent
Siemieniec et al.

(10) Patent No.: US 12,295,156 B2
(45) Date of Patent: *May 6, 2025

(54) SEMICONDUCTOR DEVICE INCLUDING TRENCH GATE STRUCTURE AND BURIED SHIELDING REGION AND METHOD OF MANUFACTURING

(71) Applicant: Infineon Technologies AG, Neubiberg (DE)

(72) Inventors: Ralf Siemieniec, Villach (AT); Wolfgang Jantscher, Villach (AT); David Kammerlander, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 18/605,438

(22) Filed: Mar. 14, 2024

(65) Prior Publication Data

US 2024/0222498 A1    Jul. 4, 2024

Related U.S. Application Data

(63) Continuation of application No. 17/353,124, filed on Jun. 21, 2021, now Pat. No. 11,961,904.

(30) Foreign Application Priority Data

Jun. 24, 2020  (EP) .................................... 20182004

(51) Int. Cl.
| | | |
|---|---|---|
| H01L 29/78 | (2006.01) | |
| H01L 29/16 | (2006.01) | |
| H01L 29/66 | (2006.01) | |
| H10D 30/01 | (2025.01) | |
| H10D 30/66 | (2025.01) | |
| H10D 62/832 | (2025.01) | |

(52) U.S. Cl.
CPC ....... *H10D 30/668* (2025.01); *H10D 30/0297* (2025.01); *H10D 62/8325* (2025.01)

(58) Field of Classification Search
CPC ............. H01L 29/7813; H01L 29/1608; H01L 29/66734
USPC .......................................................... 257/77
See application file for complete search history.

(56) References Cited

U.S. PATENT DOCUMENTS 11,961,904 B2 *  4/2024  Siemieniec ......... H01L 29/7813

* cited by examiner

*Primary Examiner* — Igwe U Anya
(74) *Attorney, Agent, or Firm* — Cooper Legal Group LLC

(57) ABSTRACT

In an example, for manufacturing a semiconductor device, first dopants are implanted through a first surface section of a first surface of a silicon carbide body. A trench is formed that extends from the first surface into the silicon carbide body. The trench includes a first sidewall surface and an opposite second sidewall surface. A spacer mask is formed. The spacer mask covers at least the first sidewall surface. Second dopants are implanted through a portion of a bottom surface of the trench exposed by the spacer mask. The first dopants and the second dopants have a same conductivity type. The first dopants and the second dopants are activated. The first dopants form a doped top shielding region adjoining the second sidewall surface. The second dopants form a doped buried shielding region adjoining the bottom surface.

20 Claims, 13 Drawing Sheets

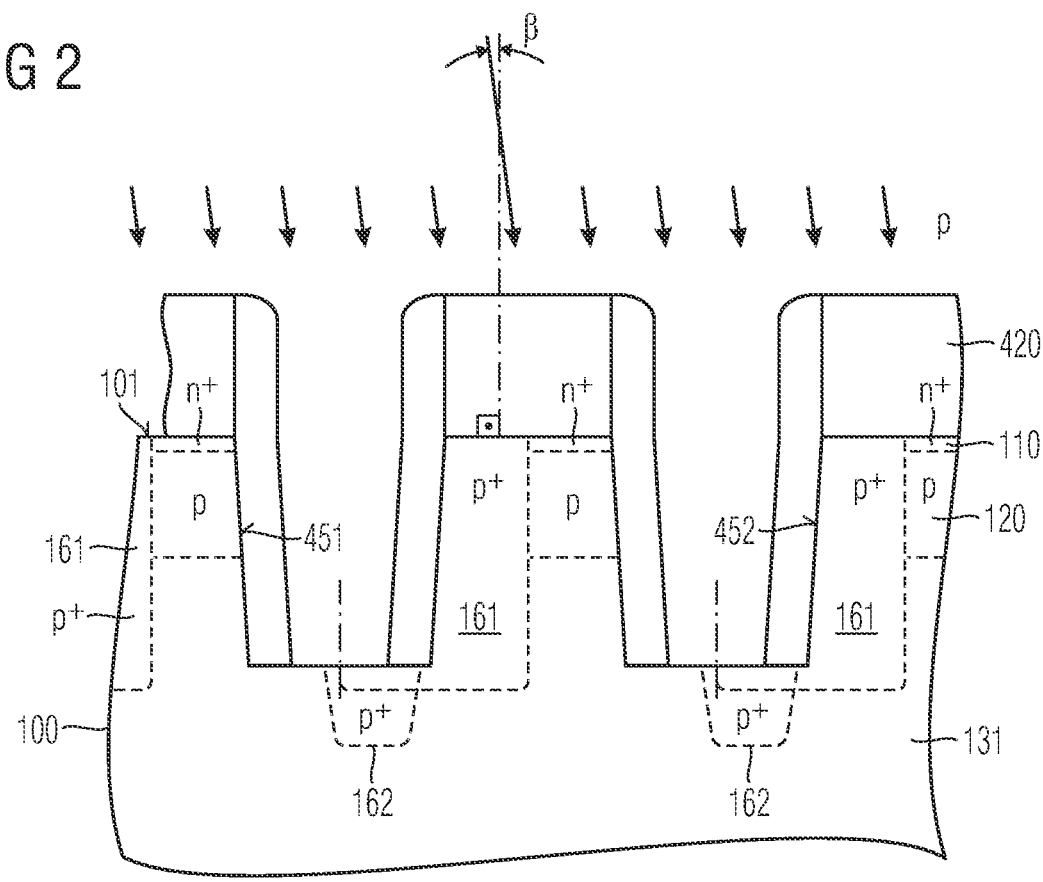

SEMICONDUCTOR DEVICE INCLUDING TRENCH GATE STRUCTURE AND BURIED SHIELDING REGION AND METHOD OF MANUFACTURING

RELATED APPLICATIONS

This application claims priority to U.S. patent application Ser. No. 17/353,124, filed on Jun. 21, 2021, entitled "SEMICONDUCTOR DEVICE INCLUDING TRENCH GATE STRUCTURE AND BURIED SHIELDING REGION AND METHOD OF MANUFACTURING", which claims priority to European Patent Application No. 20182004.0, filed on Jun. 24, 2020, entitled "SEMICONDUCTOR DEVICE INCLUDING TRENCH GATE STRUCTURE AND SHIELDING BURIED REGION AND METHOD OF MANUFACTURING". U.S. patent application Ser. No. 17/353,124 and European Patent Application No. 20182004.0 are incorporated by reference herein in their entirety.

TECHNICAL FIELD

Examples of the present disclosure relate to a semiconductor device with trench gate structure and buried shielding region, for example to a silicon carbide device. Other examples concern a method of manufacturing a semiconductor device with trench gate structure and buried shielding region, for example to a method of manufacturing a silicon carbide device.

BACKGROUND

Power semiconductor devices are typically used as switches and rectifiers in electric circuits for transforming electrical energy, for example, in DC/AC converters, AC/AC converters or AC/DC converters, and in electric circuits that drive heavy inductive loads, e.g., in motor driver circuits. Since the dielectric breakdown field strength of silicon carbide (SiC) is high compared to silicon, SiC devices may be significantly thinner and may show lower on-state resistance than their silicon counterparts. With the low diffusion velocities of dopant atoms in silicon carbide as compared to silicon, formation of doped regions in silicon carbide often requires more effort than it is the case for equivalent silicon devices.

There is a need for a silicon carbide device that can be efficiently manufactured at lower costs and without loss of performance.

SUMMARY

An embodiment of the present disclosure relates to a method of manufacturing a semiconductor device. First dopants are implanted through a first surface section of a first surface of a silicon carbide body. A trench is formed that extends from the first surface into the silicon carbide body. The trench includes a first sidewall surface and an opposite second sidewall surface. A spacer mask is formed. The spacer mask covers at least the first sidewall surface. Second dopants are implanted through a portion of a bottom surface of the trench exposed by the spacer mask. The first dopants and the second dopants have a same conductivity type. The first dopants (e.g., the implanted first dopants) and the second dopants (e.g., the implanted second dopants) are activated. The first dopants form a doped top shielding region adjoining (e.g., directly adjoining) the second sidewall surface. The second dopants form a doped buried shielding region adjoining (e.g., directly adjoining) the bottom surface.

An embodiment of the present disclosure relates to a semiconductor device. The semiconductor device includes a trench gate structure, a top shielding region and a buried shielding region. The trench gate structure extends from a first surface into a silicon carbide body and has a first sidewall and an opposite second sidewall. The top shielding region extends along the second sidewall from the first surface into the silicon carbide body. The buried shielding region extends along a bottom area of the trench gate structure. The buried shielding region and the top shielding region are connected. A first lateral edge of the buried shielding region oriented to the top shielding region is below the trench gate structure and/or below the top shielding region.

An embodiment of the present disclosure relates to a method of manufacturing a semiconductor device. First dopants are implanted through a first surface section of a first surface of a silicon carbide body. A trench is formed that extends from the first surface into the silicon carbide body. The trench includes a first sidewall surface and an opposite second sidewall surface. A spacer mask is formed. The spacer mask covers at least the first sidewall surface. Second dopants are implanted through a portion of a bottom surface of the trench exposed by the spacer mask. The first dopants and the second dopants have a same conductivity type. The first dopants (e.g., the implanted first dopants) and the second dopants (e.g., the implanted second dopants) are activated. The first dopants form a doped top shielding region adjoining (e.g., directly adjoining) the second sidewall surface. The second dopants form a doped buried shielding region adjoining (e.g., directly adjoining) the bottom surface. In a direction from the first sidewall surface to the second sidewall surface, the buried shielding region ends below the trench and/or below the top shielding region. A lateral center of the buried shielding region is between a lateral center of the trench and the second sidewall surface.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a semiconductor device and a method of manufacturing a semiconductor device and together with the description serve to explain principles of the embodiments. Further embodiments are described in the following detailed description and the claims.

FIG. 2 shows a schematic vertical cross-sectional view of a portion of a silicon carbide body for illustrating a method of manufacturing a semiconductor device according to an embodiment using a spacer mask and a tilted implantation beam.

DETAILED DESCRIPTION

Figure 1A:
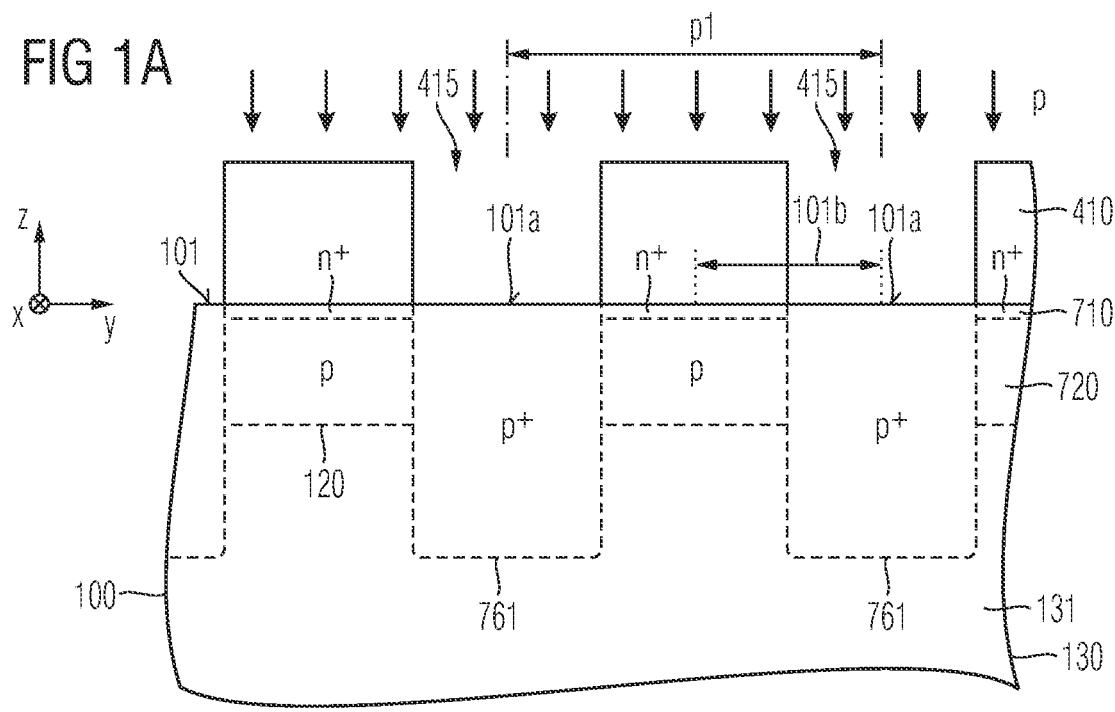
FIGS. 1A-1G show schematic vertical cross-sectional views of a portion of a silicon carbide body for illustrating a method of manufacturing a semiconductor device with a buried shielding region according to an embodiment.

In the following detailed description, reference is made to the accompanying drawings, which form a part hereof and in which are shown by way of illustrations specific embodiments in which a semiconductor device and a method of manufacturing a semiconductor device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening elements adapted for signal and/or power transmission may be connected between the electrically coupled elements, for example, elements that are controllable to temporarily provide a low-resistive connection in a first state and a high-resistive electric decoupling in a second state.

A safe operating area (SOA) defines voltage and current conditions over which a semiconductor device can be expected to operate without self-damage. The SOA is given by published maximum values for device parameters like maximum continuous load current, maximum gate voltage and others.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Ranges given for physical dimensions include the boundary values. For example, a range for a parameter y from a to b reads as a≤y≤b. The same holds for ranges with one boundary value like "at most" and "at least".

A conformal layer has a thickness that is substantially the same along an interface to a base on which the conformal layer is formed. A conformal layer may exhibit marginal thickness variations along edges, steps or other elements of the base but is nevertheless considered a conformal layer if the magnitude of the thickness variations is low compared to a mean thickness of the conformal layer. A conformal layer may be formed by thin-film deposition methods such as CVD (chemical vapor deposition), plating, or ALD (atomic layer deposition).

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

As regards structures and doped regions formed in a semiconductor body, a second region is "below" a first region if a minimum distance between the second region and a first surface at the front side of the silicon carbide body is greater than a maximum distance between the first region and the first surface. The second region or a junction is "directly below" the first region, where the vertical projections of the first and second regions or the vertical projections of the first region and the junction into the first surface overlap. The vertical projection is a projection orthogonal to the first surface. A "horizontal plane" is a plane parallel to a planar first surface or parallel to coplanar surface sections of the first surface.

According to an embodiment, a method of manufacturing a semiconductor device may include implanting first dopants through a first surface section of a first surface of a silicon carbide body.

The silicon carbide body may have two essentially parallel main surfaces, which may have approximately the same shape and size. The silicon carbide body may be integral portion of a semiconductor substrate, e.g. a semiconductor wafer. The semiconductor substrate may include a plurality of identical or almost identical silicon carbide bodies formed side-by-side in lines and rows and separated from each other by straight kerf streets. The silicon carbide body may be a cylinder, e.g. a right cylinder. Alternatively, the silicon carbide body may be a polygonal, e.g. rectangular or hexagonal prism, e.g. right prism, with or without rounded edges.

The silicon carbide body may have a surface extension along two horizontal directions. The horizontal directions are parallel to an x-axis and to a y-axis, wherein x-axis and y-axis are orthogonal to each other. The silicon carbide body may have a thickness along a vertical direction perpendicular to the horizontal directions. The vertical direction is parallel to a z-axis, which is orthogonal to the x-axis and to the y-axis.

In the following, the horizontal directions are also referred to as lateral directions. The main surface at the front side is referred to as first surface. The main surface on the opposite side of the silicon carbide body is referred to as second surface.

The material of the silicon carbide body may be single crystalline silicon SiC, for example 15R—SiC (silicon carbide with 15R-polytype), or silicon carbide with a hexagonal polytype like 2H—SiC, 4H—SiC or 6H—SiC. In addition to the main constituents, e.g. silicon and carbon, the silicon carbide body may include dopant atoms, for example nitrogen (N), phosphorous (P), beryllium (Be), boron (B), aluminum (Al) and/or gallium (Ga). The silicon carbide body may also include further impurities such as hydrogen (H), fluorine (F) and/or oxygen (O).

The first dopants may be donator or acceptor atoms. The first dopants may be implanted with high selectivity (e.g., selectivity higher than a threshold selectivity) through the first surface section of the first surface (e.g., the first dopants may be implanted with high selectivity only through the first surface section of the first surface). During implantation of the first dopants, an implant mask may cover further surface sections of the first surface on both sides of the first surface section. The first surface section and the further surface sections may be stripe-shaped with a longitudinal axis parallel to the x-axis and with a width along the y-axis.

A trench may be formed that extends from the first surface into the silicon carbide body. The trench may be formed after removing or modifying the implant mask. The trench may be stripe-shaped with a longitudinal axis parallel to the x-axis. The trench may be formed such that the trench opening adjoins (e.g., directly adjoins) the first surface section or overlaps a portion of the first surface section. In other words, a portion of the trench may be introduced through a portion of the first surface section and/or a portion of one of the adjoining further surface sections. The trench may be formed prior to or after implanting the first dopants.

A first sidewall surface of the trench is averted from the first surface section and an opposite second sidewall surface (e.g., a sidewall surface of the trench that is opposite to the first sidewall surface) is oriented to the first surface section or formed below the first surface section. The first and second sidewall surfaces may run parallel to each other along the x-axis. The first and second sidewall surfaces may be vertical or approximately vertical. Alternatively, the trench may taper with increasing distance to the first surface, wherein the first and second sidewall surfaces may be tilted to the z-axis by about 4 degrees and by about −4° degrees.

A spacer mask may be formed that may cover at least the first sidewall surface. The spacer mask exposes a portion of the trench bottom surface. The spacer mask may cover or may expose the second sidewall surface.

Second dopants may be implanted through the exposed portion of the trench bottom surface. The first dopants and the second dopants have the same conductivity type.

The implanted first and second dopants may be activated. For example, a heat treatment anneals the crystal damage caused by ion implantation and moves the dopant atoms to regular crystal sites, wherein the implanted dopants are electrically activated. The activated first dopants may define a doped top shielding region. The top shielding region may adjoin (e.g., directly adjoin) the second sidewall surface and may extend from the first surface into the silicon carbide body. The activated second dopants may define a doped buried shielding region. The buried shielding region adjoins (e.g., directly adjoins) the trench bottom surface. The top shielding region and the buried shielding region may be connected (e.g., directly connected).

In a blocking mode (off-state) of a semiconductor device obtained from the silicon carbide body, the buried shielding region may protect a structure formed in the trench against high electric field strength (e.g., an electric field strength higher than a threshold electric field strength). The top shielding region may electrically connect the buried shielding a region with conductive structure formed on or above the first surface.

Forming the buried shielding region by ion implantation through the trench bottom surface instead of through the first surface may reduce (e.g., significantly reduce) the required implantation energy, may reduce lateral straddling of the implanted dopants, and/or may require a less extensive implantation mask. With the reduced lateral straddling it may become possible to laterally confine the buried shielding region to a comparatively narrow region below the trench and possibly below a comparatively small portion of the top shielding region. With a comparatively narrow buried shielding region it may become possible to improve a lateral distribution of a load current in a conducting mode (on state) of the semiconductor device obtained from the silicon carbide body.

According to an embodiment, in a lateral direction from the first sidewall surface to the second sidewall surface the buried shielding region may end below the trench and/or below the top shielding region. In the opposite direction from the second sidewall surface to the first sidewall surface, the buried shielding region may end below the trench.

For example, a vertical extension of the top shielding region may be greater than the sum of the vertical extensions of the trench and the buried shielding region, wherein at the side oriented to the top shielding region the buried shielding region may laterally end at the top shielding region and below the trench and/or below the top shielding region. According to another example, a vertical extension of the top shielding region may be smaller than the sum of the vertical extensions of the trench and the buried shielding region and at the side oriented to the top shielding region the buried shielding region may laterally end below the top shielding region.

For example, in direction of the second sidewall surface the buried shielding region may extend along at most 50%, e.g. at most 20% or at most 10% of the lateral extension of the top shielding region at the first surface along the same direction. In the lateral directions the buried shielding region may end at pn junctions, which may form between the buried shielding region and oppositely doped current spread regions or other portions of the drain/drift structure (e.g., a structure including a drain structure and/or a drift structure). The current spread regions and the buried shielding region or the pertinent drift zone portions and the buried shielding region may form pn junctions which extend tilted to the horizontal plane.

With a comparatively narrow buried shielding region that laterally does not extend beyond the top shielding region it may become possible to improve a lateral distribution of a load current through the current spread region and/or the pertinent drift zone portion.

According to an embodiment, a lateral center of the buried shielding region may be between a lateral center of the trench and the second sidewall surface.

In case the edge between the bottom surface and the second sidewall surface is rounded, the lateral center of the buried shielding region is between a lateral center of the trench and the cross-sectional line between the linear extension of the straight portion of the second sidewall surface and the linear extension of the straight portion of the bottom surface.

According to an embodiment, at least a portion of the second dopants may be implanted with an implantation beam axis tilted with respect to the vertical direction at an implant angle β in a vertical plane orthogonal to a horizontal longitudinal extension of the trench. The implantation beam axis may be directed to the second sidewall surface.

For silicon carbide bodies with the c-axis tilted by about 4 degrees in direction of the first sidewall surface, the implant angle may be about 4 degrees to exploit channeling and to avoid ion back scattering or may be at least 7 degrees or at least 11 degrees to avoid channeling.

The tilted implantation oriented away from the first sidewall surface may reduce number and/or energy of dopant atoms impinging onto the first sidewall surface as a consequence of process imperfections, e.g. scattering. In addition, lateral dopant straggling in the silicon carbide body in direction of the first sidewall surface may be reduced. The tilted implantation may contribute in reducing possible adverse effects of the dopants on device characteristics like channel resistance and/or threshold voltage.

According to an embodiment, forming the trench may include forming a hard mask on the first surface. The hard mask may include a hard mask opening that exposes a second surface section of the first surface. An etch process that uses the hard mask as etch mask may form the trench. The second surface section and the first surface section may partially overlap. For example, the second surface section includes at least 10%, at least 20%, e.g. about 50% of the first surface section.

Forming the spacer mask may include forming a mask layer that covers the first sidewall surface, the second sidewall surface and the bottom surface, and selectively removing horizontal layer portions of the mask layer. The hard mask and remaining vertical layer portions of the mask layer may form the spacer mask.

According to an embodiment, formation of the spacer mask may include exposing and recessing a portion of the bottom surface of the trench. For example, forming the spacer mask may include deposition of a conformal mask layer (e.g., a highly conformal mask layer) in combination with an anisotropic etch (e.g., a highly anisotropic etch), such as reactive ion etching. The conformal mask layer has a thickness less than half the trench width and lines the trench. The anisotropic etch removes horizontal sections of the mask layer. After removal of the horizontal mask layer section at the trench bottom surface, the anisotropic etch may proceed and may form a shallow recess in the trench bottom.

According to an embodiment, forming the spacer mask may include forming an auxiliary mask layer that fills the trench and that covers the first surface. The auxiliary mask layer may fill the trench completely. A first auxiliary mask layer portion that adjoins (e.g., directly adjoins) the second sidewall surface may be selectively removed. For example, a photoresist layer may be deposited on the auxiliary mask layer, a photolithographic patterning process may open the photoresist layer selectively above the first auxiliary mask layer portion, and a directed etch process selectively removes the exposed first auxiliary mask layer portion.

A remaining second auxiliary mask layer portion covering at least the first sidewall surface forms the spacer mask. For example, the second auxiliary mask layer portion covers the first sidewall surface and an adjoining (e.g., directly adjoining) portion of the trench bottom surface.

Another embodiment refers to a semiconductor device which may include a silicon carbide body with a first surface at a front side and a second surface opposite to the front side. The first and second surfaces are approximately parallel to each other and may have approximately the same shape and size. A lateral surface area connects the edges of the first and second surfaces.

A trench gate structure extends from a first surface into the silicon carbide body. The trench gate structure includes a first sidewall and an opposite second sidewall (e.g., a sidewall of the trench gate structure that is opposite to the first sidewall surface). The first and second sidewalls may run parallel to each other along the horizontal x-axis. The first and second sidewalls may be vertical or approximately vertical. Alternatively, the trench gate e structure may taper with increasing distance to the first surface, wherein the first and second sidewalls may be tilted to the z-axis by about 4 degrees and −4° degrees. A bottom area connects the first and second sidewalls. Transitions between the bottom area and the first and second sidewalls may be rounded.

Along the first sidewall, a source region and a body region of a transistor cell may adjoin (e.g., directly adjoin) the trench gate structure. The source region may be formed between the first surface and the body region. The body region may separate the source region from a drain/drift structure. The body region and the drain/drift structure may form a first pn junction. The body region and the source region may form a second pn junction.

Along the second sidewall a top shielding region may extend from the first surface into the silicon carbide body. The top shielding region and the body region may have the same conductivity type.

A buried shielding region may extend parallel to the bottom area of the trench gate structure. The buried shielding region and the top shielding region may have the same conductivity type and may be connected (e.g., directly connected) with each other.

A first lateral edge of the buried shielding region oriented to the first sidewall may be below (e.g., directly below) the trench gate structure. A second lateral edge of the buried shielding region oriented to the second sidewall and to the top shielding region may be below (e.g., directly below) the trench gate structure and/or below (e.g., directly below) the top shielding region.

A comparatively narrow buried shielding region that does not laterally extend beyond the top shielding region may contribute to a more uniform lateral distribution of a load current through the drain/drift structure in the device on-state.

According to an embodiment a lateral center of the buried shielding region may be between a lateral center of the trench gate structure and the second sidewall, wherein the lateral extension of the buried shielding region is further reduced.

According to an embodiment, a vertical extension of the top shielding region may be smaller than a vertical extension of the trench gate structure. A connection portion of the buried shielding region may extend along the second sidewall from the top shielding region to a horizontal plane coplanar with the bottom surface of the trench gate structure.

Reducing the vertical extension of the comparatively wide top shielding region may reduce the number of the required implants for form forming the top shielding region and/or may contribute to a better lateral distribution of a load current through the drain/drift structure.

According to an embodiment the bottom area of the trench gate structure may include a local recess.

According to an embodiment a dopant concentration in the top shielding region may have a maximum at the second sidewall of the trench gate structure in a horizontal plane at half of a vertical extension of the top shielding region. A higher dopant concentration along the second sidewall may improve suppression of a parasitic MOS channel along the second sidewall of the trench gate structure. A higher dopant concentration in a portion of the top shielding region close to a body region of an adjoining transistor cell may contribute to reducing a drain induced barrier lowering.

Another embodiment refers to a power conversion assembly including a semiconductor device as described above. The trench gate structure of the semiconductor device may include a gate electrode. The power conversion assembly further includes a gate driver circuit that includes a gate output terminal electrically connected to the gate electrode.

The embodiments of FIG. 1A to FIG. 5 refer to symmetric spacer masks.

FIGS. 1A to 1G illustrate a method of manufacturing a semiconductor device with trench gate structure and buried shielding region. The illustrated manufacturing processes may be applied at wafer level. At wafer level, a semiconductor substrate, e.g. a semiconductor wafer, includes a plurality of chip areas arranged in lines and rows. Dicing streets (kerf lines) separate neighboring chip areas from each other. Each chip area represents a silicon carbide body 100, which a dicing process along the dicing streets later separates from the other silicon carbide bodies.

The silicon carbide body 100 has a first surface 101 at a front side and a second surface opposite to the front side. The first surface 101 is a section of a front side surface of the semiconductor substrate. The second surface is a section of back side surface of the semiconductor substrate. The first surface 101 and the second surface may be parallel to each other, wherein the first surface 101 may be planar or ripped. In case of a ripped first surface 101, a mean plane through the ripped main surface 101 is considered as first surface 101 for simplicity in the following.

The silicon carbide body 100 extends along a main extension plane in horizontal directions along the x-axis and the y-axis orthogonal to the x-axis. The horizontal directions are also referred to as lateral directions in the following. In a vertical direction along the z-axis and perpendicular to the horizontal directions, the silicon carbide body 100 has a thickness, which is small compared to the extension of the silicon carbide body 100 along the main extension plane.

The vertical direction of the silicon carbide body 100 may coincide with a main lattice direction or may be tilted with respect to a main lattice direction by an off-axis angle, wherein the off-axis angle may be in a range from 2° to 8° in absolute value. For example, the off-axis angle may be about 4°.

A total thickness of the silicon carbide body 100 between the first surface 101 and the second surface is related to a nominal blocking capability of the manufactured silicon carbide device and may be in the range of several hundred nm to several hundred µm.

The illustrated embodiments refer to semiconductor devices with n-channel transistor cells with n doped source regions and with p doped body regions. Accordingly, the conductivity type of the source regions—or first conductivity type is n-type—and the conductivity type of the body regions—or second conductivity type—is p-type. The disclosure with regard to the n-channel transistor cells may apply, mutatis mutandis, to p-channel transistor cells by reversing the conductivity type of the source and body regions.

The silicon carbide body 100 includes a drain/drift structure 130 with a lightly n doped drift zone 131. In addition, the drain/drift structure 130 may include a current spread layer between the first surface 101 and the dirt zone 131, wherein a mean dopant concentration in the current spread layer is higher than a mean dopant concentration in the drift zone 131. The drift zone 131 may be and/or may include an epitaxial layer. A body layer 720 is formed on the drift zone 131. The body layer 720 may contain acceptor atoms. A source layer 710 may be formed on the body layer 720. The source layer 710 may contain donator atoms. Alternatively, acceptor atoms and/or the donator atoms may be introduced into the source layer 710 and/or the body layer 720 at a later point in time.

An implant mask 410 is formed on the first surface 101. Implant mask openings 415 in the implant mask 410 expose first surface sections 101a of the first surface 101. The implant mask openings 415 may be stripe-shaped with an opening length along the x-axis and with an opening width along the y-axis. The opening length is greater than the opening width. The implant mask openings 415 may have a uniform width and a uniform center-to-center distance p1. The center-to-center distance p1 may be in a range from 500 nm to 4 µm. First dopants are implanted through the implant mask openings 415 into first implant regions 761.

As illustrated in FIG. 1A, the first implant regions 761 containing the implanted first dopants may extend from the first surface 101 through the source layer 710 and the body layer 720 into the drain/drift structure 130.

The implant mask 410 may be removed. A hard mask 421 may be formed on the first surface 101. Hard mask openings 429 in the hard mask 421 expose second surface sections 101b of the first surface 101. The hard mask openings 429 may be stripe-shaped with an opening length along the x-axis and with an opening width along the y-axis. The opening length is greater than the opening width. The hard mask openings 429 may have a uniform width and the same center-to-center distance p1 as the implant mask openings 415 in FIG. 1A. The second surface sections 101b and the first surface sections 101a may overlap. Trenches 450 are etched into the silicon carbide body 100. The second surface sections 101b define the trench openings of the trenches 450.

Figure 1B:
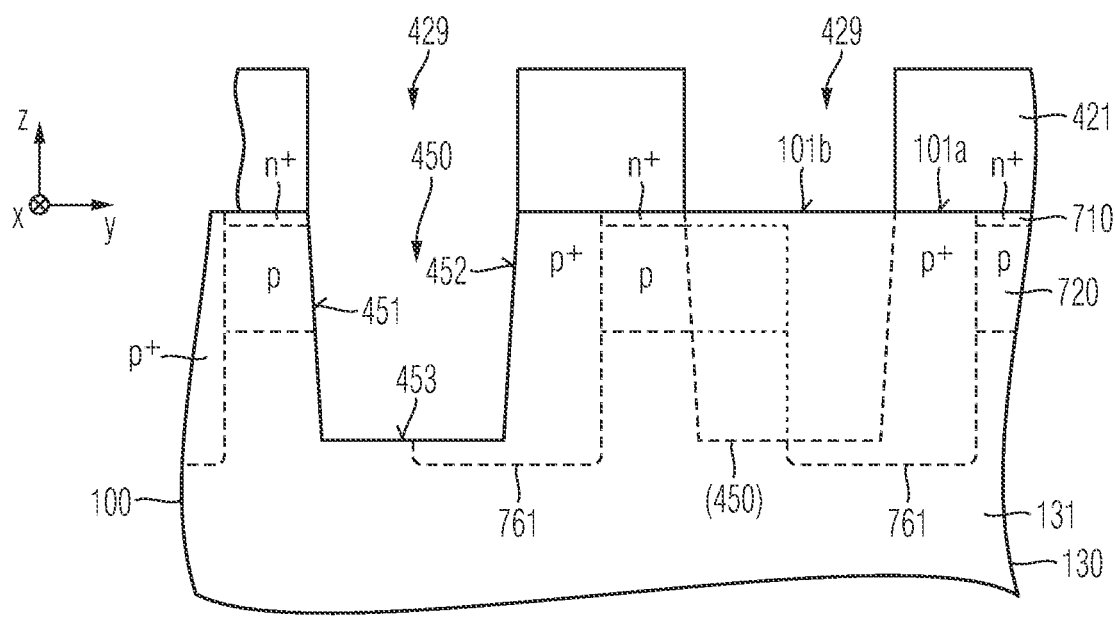

On the right hand side, FIG. 1B shows a hard mask opening 429 exposing a second surface section 101b before the trench etch. On the left hand side, FIG. 1B shows a trench 450 etched into the silicon carbide body 100 below the hard mask opening 429. Each trench 450 may consume a portion of one first implant region 761 and laterally adjoining (e.g., directly adjoining) portions of the source layer 710, the body layer 720 and the drain/drift structure 130. A first sidewall surface 451 of each trench 450 laterally exposes side surfaces of the source layer 710, the body layer 720 and the drain/drift structure 130.

In the illustrated embodiment the vertical extension of the first implant region 761 is greater than the vertical extension of the trench 450 such that each second sidewall surface 452 exclusively exposes a lateral surface of the first implant region 761. The bottom surface 453 connects the first sidewall surface 451 and the second sidewall surface 452. A first bottom surface portion oriented to the first sidewall surface 451 exposes the drain/drift structure 130. A second bottom surface portion oriented to the second sidewall surface 452 exposes the first implant region 761.

A conformal mask layer 422 (e.g., a highly conformal mask layer) is deposited. The mask layer 422 may be and/or may include TEOS (tetraethylorthosilane) silicon oxide.

Figure 1C:
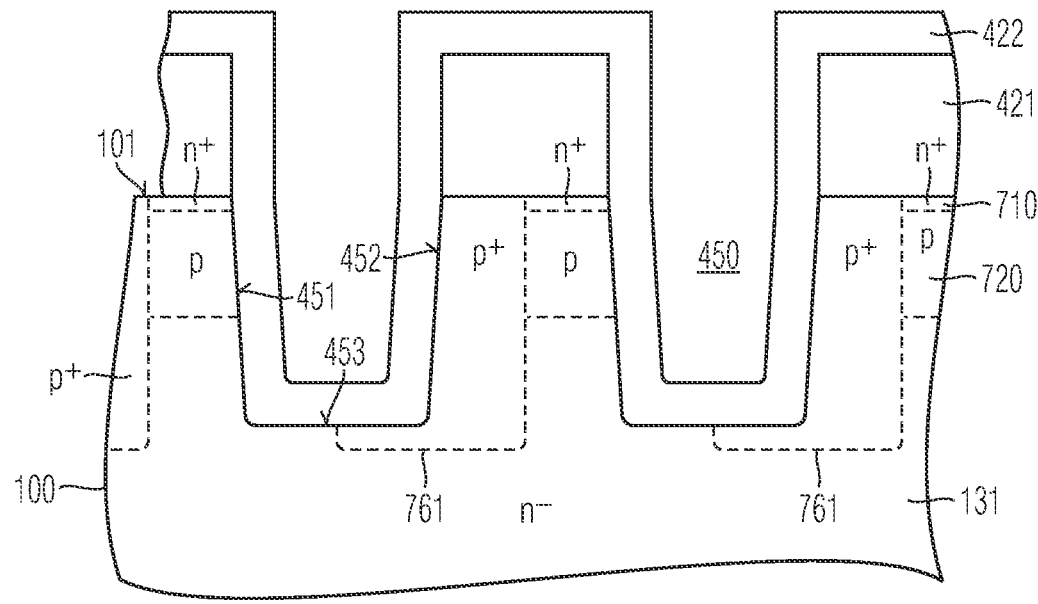

FIG. 1C shows that the mask layer 422 may cover the hard mask 421, the first sidewall surface 451, the second sidewall surface 452, and the bottom surface 453 at approximately uniform thickness.

A spacer etch method removes horizontal sections of the mask layer 422 on the hard mask 421 and at the trench bottom. The spacer etch may include reactive ion beam etching, by way of example. A stray oxide 220 may be formed in an exposed central section of the trench bottom surface 453. The stray oxide 220 may be formed by deposition and/or by thermal treatment in an oxidizing atmosphere. An implantation beam implants second dopants through openings in the patterned mask layer and, if applicable, through the stray oxide 220. The comparatively thick hard mask may contribute to preventing implantation through the first surface 101. An implantation beam axis of the implantation beam may be vertical, almost vertical or may be tilted (e.g., significantly tilted), e.g. by more than 10°, in a vertical plane orthogonal to the cross-sectional plane.

Figure 1D:
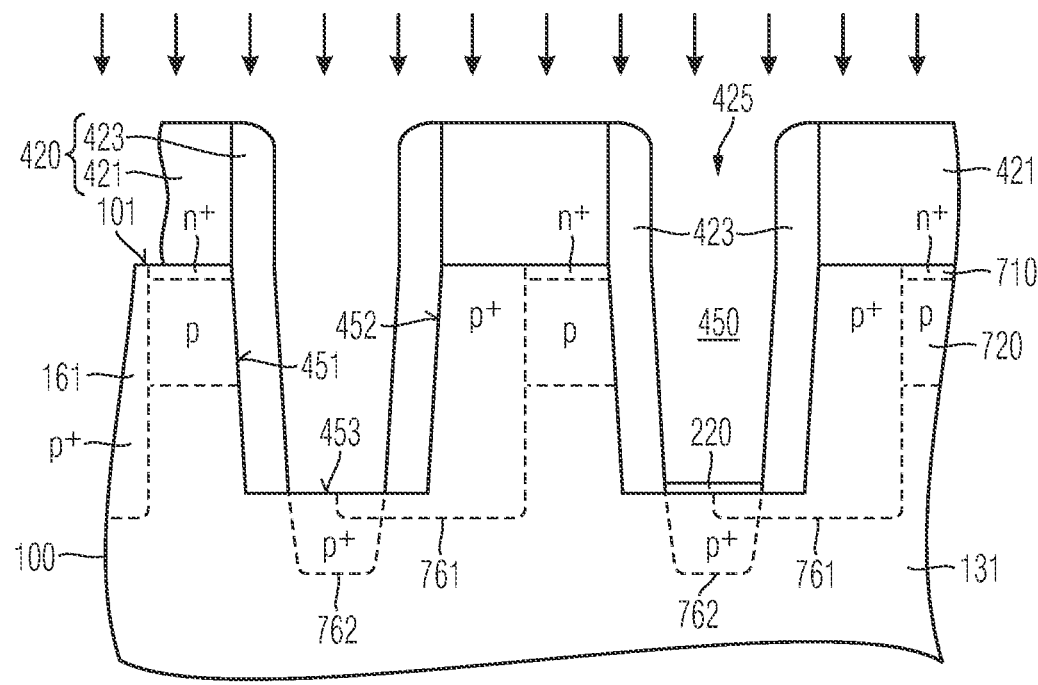

According to FIG. 1D the patterned mask layer and the hard mask 421 form a spacer mask 420. The spacer mask 420 includes mask spacers 423 covering the first and second sidewall surfaces 451, 452 and lining the hard mask openings. Each spacer mask opening 425 in the spacer mask 420 exposes a central section of the bottom surface 453 of a trench 450. On the right hand side, a stray oxide 220 covers the central section of the bottom surface 453. The second dopants form second implant regions 762 in sections of the silicon carbide body 100 below the spacer mask openings 425.

The spacer mask 420 and the stray oxide 220 are removed. A heat treatment may electrically activate the implanted dopants.

Figure 1E:
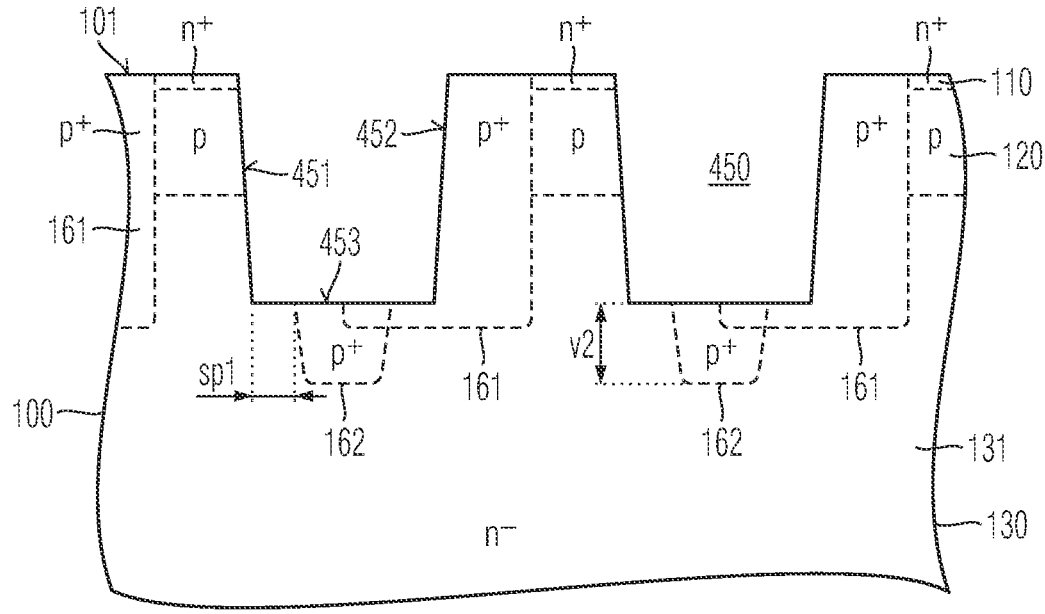

FIG. 1E shows a top shielding region 161 defined by the activated dopants in the first implant region 761 of FIG. 1D, a buried shielding region 162 defined by the activated dopants in the second implant region 762 of FIG. 1D, body regions 120 defined by the dopants contained in the body layer 720 of FIG. 1A and source regions 110 defined by the dopants contained in the source layer 710 of FIG. 1A.

The buried shielding region 162 may have a vertical extension v2 in a range from 200 nm to 2 μm. A lateral distance sp1 between the first sidewall surface 451 and the buried shielding region 162 may be in a range from 0 nm to 500 nm. At the side oriented to the second sidewall surface 452, the buried shielding region 162 and the top shielding region 161 may overlap and may adjoin (e.g., directly adjoin) each other.

An optional heat treatment in an atmosphere containing, for example, hydrogen may round transitions between the bottom surface 453 and the two sidewall surfaces 451, 452.

Figure 1F:
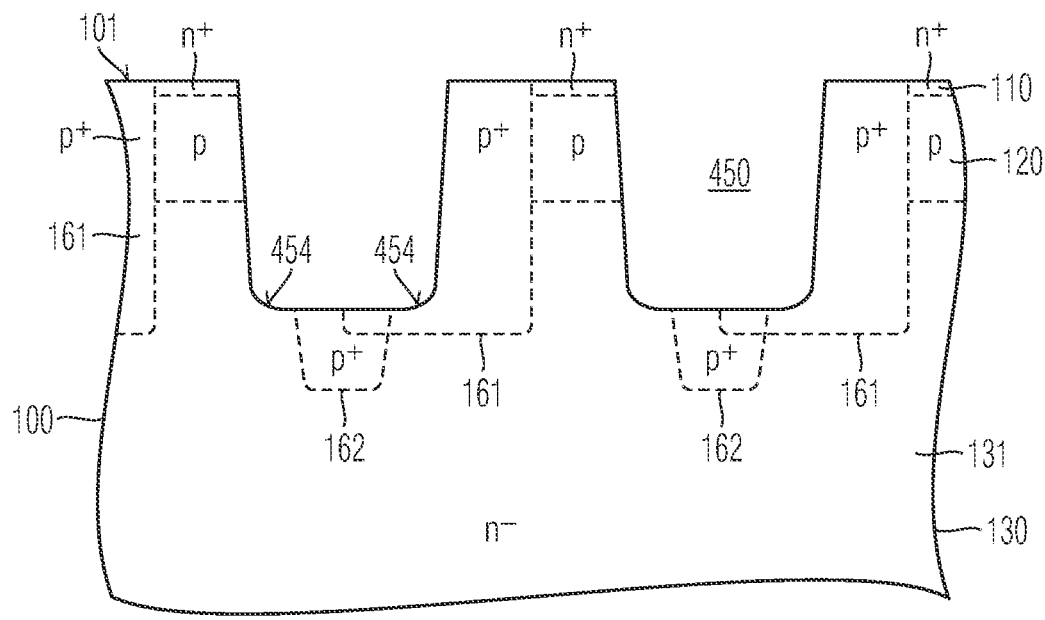

FIG. 1F shows the rounded edges 454 between the bottom surface 453 and the first sidewall surface 451 and between the bottom surface 453 and the second sidewall surface 452. A thermal treatment in an oxidizing atmosphere may form a sacrificial oxide layer on exposed semiconducting surfaces of the silicon carbide body 100. The sacrificial oxide layer may be removed.

A dielectric liner may be formed. Forming the dielectric liner may include thermal oxidation of exposed semiconductor material and/or deposition of one or more dielectric materials. One or more conductive materials may be deposited. The one or more conductive materials may include heavily doped polycrystalline silicon. One or more conductive materials deposited outside the trenches 450 may be removed.

Figure 1G:
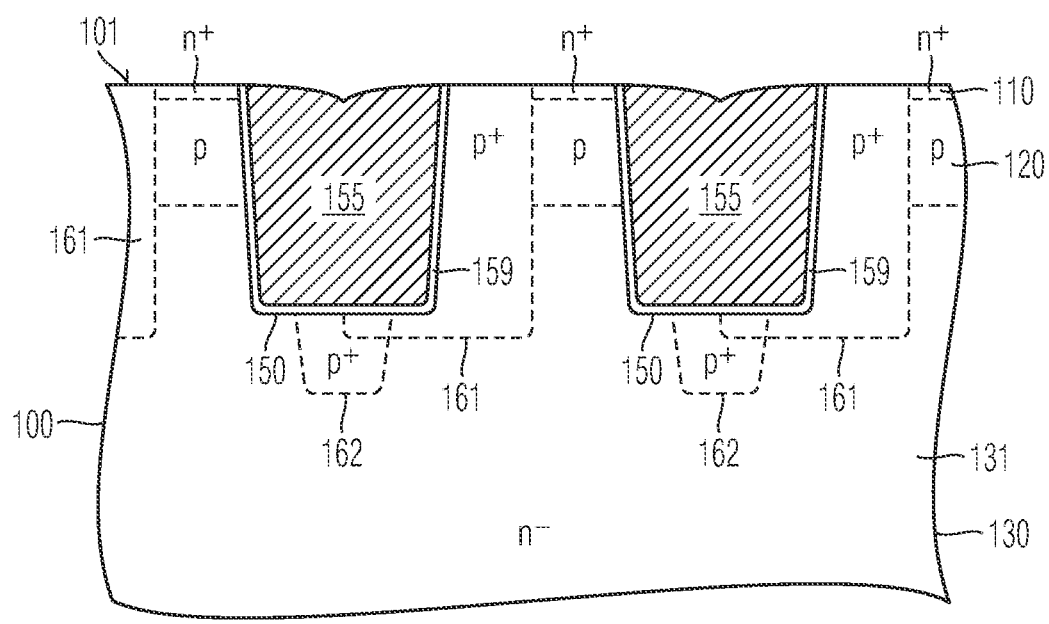

As illustrated in FIG. 1G, a portion of the dielectric liner lining the trench 450 of FIG. 1F forms a gate dielectric 159. A portion of the conductive material deposited in the trenches 450 forms a gate electrode 155.

An interlayer dielectric may be deposited on the first surface 101 and on the gate electrodes 155. First and second contact openings may be formed in the interlayer dielectric. The first contact openings expose, in a cell array region, portions of the top shielding region 161 and the source regions 110. The second contact openings expose, in a peripheral region, the gate electrode 155. First contacts are formed in the first contact openings and second contacts are formed in the second contact openings. A front side metallization is formed on the interlayer dielectric. The front side metallization includes a first load electrode and a gate pad/wiring structure (e.g., a structure including a gate pad structure and/or a gate wiring structure). The first contacts electrically connect the first load electrode with the source regions and with the top shielding regions. The second contacts electrically connect the gate pad/wiring structure and the gate electrodes. A second load electrode is formed on the second surface. A dicing process separates the silicon carbide body 100 from the semiconductor substrate. Each singularized silicon carbide body 100 may form a semiconductor die (chip) of one semiconductor device.

In the embodiment of FIG. 2 an implantation beam axis of the implantation beam implanting the second dopants may be tilted (e.g., significantly tilted) in the cross-sectional plane by an implant angle β. The implantation beam points away from the first sidewall surface 451 and points into the direction of the second sidewall surface 452. For silicon carbide bodies 100 with the c-axis tilted by about 4 degrees in direction of the first sidewall surface 451, the implant angle β may be about 4 degrees such that the implantation beam axis and the c-axis are parallel or approximately parallel and channeling occurs. After dopant activation, a lateral center of the buried shielding region 162 is between the lateral center of the trench 450 and the second sidewall surface 452.

The tilted implantation of FIG. 2 may be combined with the rather vertical implantation shown in FIG. 1D. For example, implantation of the second dopants may include at least two implantations at different implant angles β.

Figure 3:
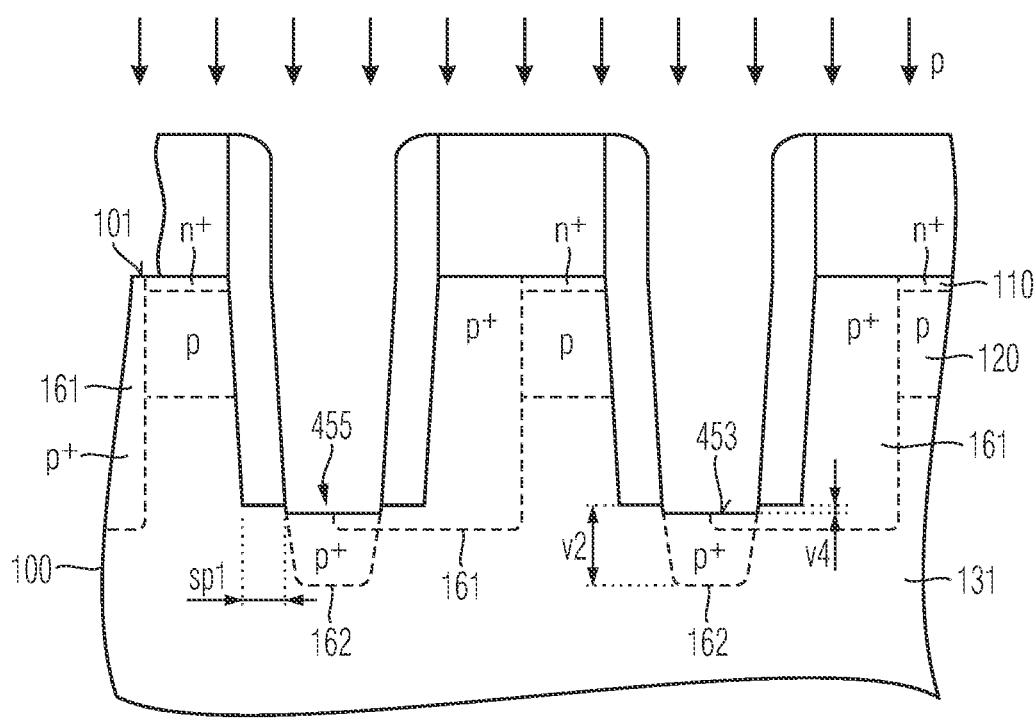
FIG. 3 shows a schematic vertical cross-sectional view of a portion of a silicon carbide body for illustrating a method of manufacturing a semiconductor device according to an embodiment using a spacer mask and a non-tilted or low-tilted implantation beam.

FIG. 3 shows a shallow recess 455 in the trench bottom surface 453. The recess 455 may result from an etch process forming the spacer mask opening 425 in the spacer mask 420 as described with reference to FIG. 1C and FIG. 1D. After removal of the horizontal portion of the mask layer 422 of FIG. 1C from the trench bottom surface 453, the etch process may be effective for some time on the exposed section of the trench bottom surface 453. The recess 455 may have a vertical extension v4 in a range from 0 nm to 100 nm. A lateral distance between the first sidewall surface 451 and the recess 455 may be approximately the same as the lateral distance sp1 between the first sidewall surface 451 and the buried shielding region 162.

Figure 4A:
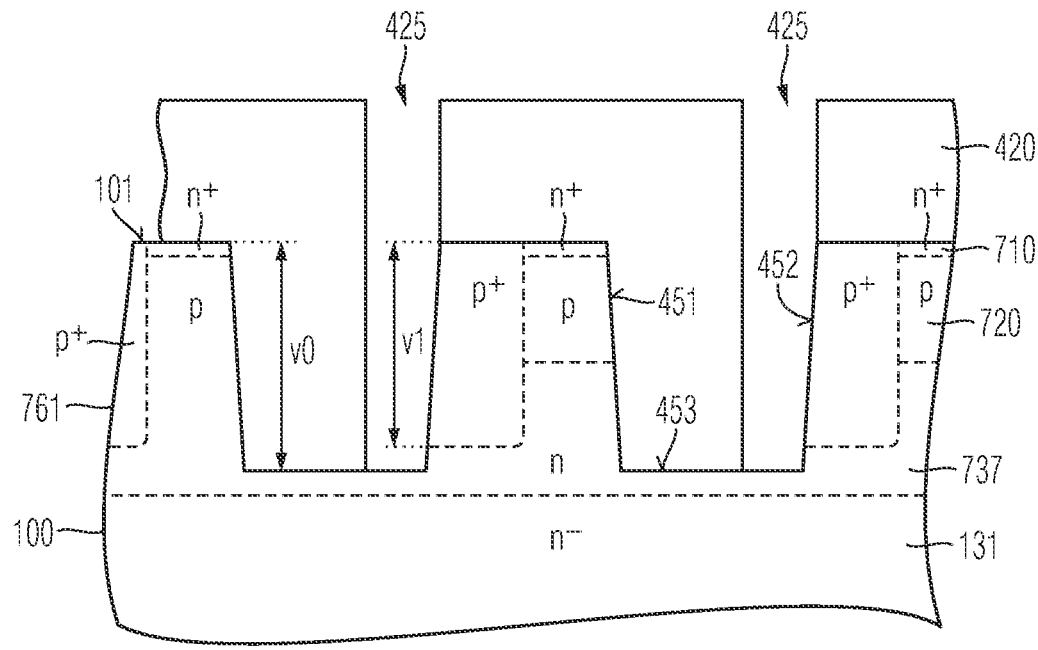
FIGS. 4A-4B show schematic vertical cross-sectional views of a portion of a silicon carbide body for illustrating a method of manufacturing a semiconductor device according to an embodiment using a spacer mask that selectively exposes one trench sidewall surface for a non-tilted or low-tilted implantation beam.
Figure 4B:
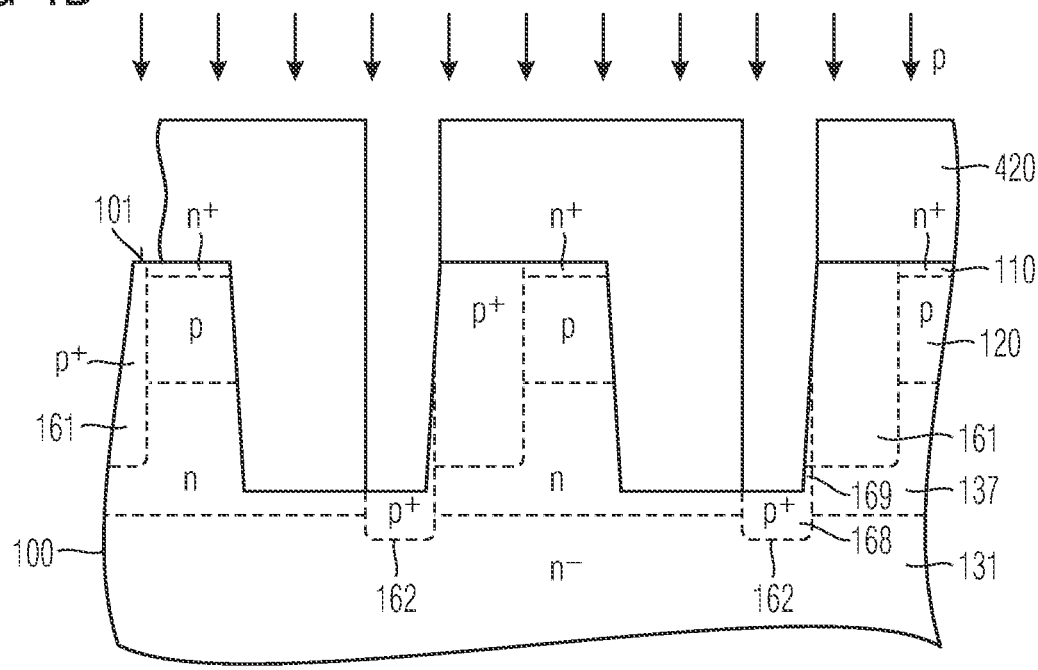
Figure 5:
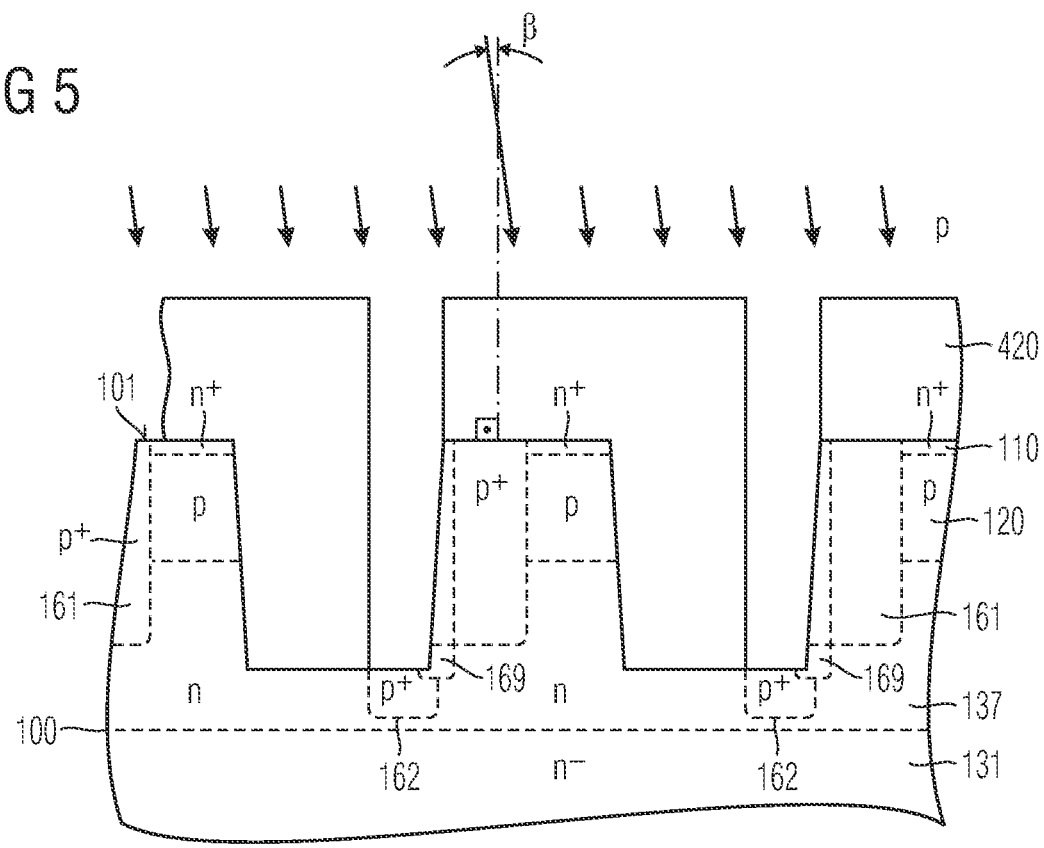
FIG. 5 shows a schematic vertical cross-sectional view of a portion of a silicon carbide body for illustrating a method of manufacturing a semiconductor device according to an embodiment using a spacer mask that selectively exposes one trench sidewall surface for a tilted implantation beam.
Figure 6:
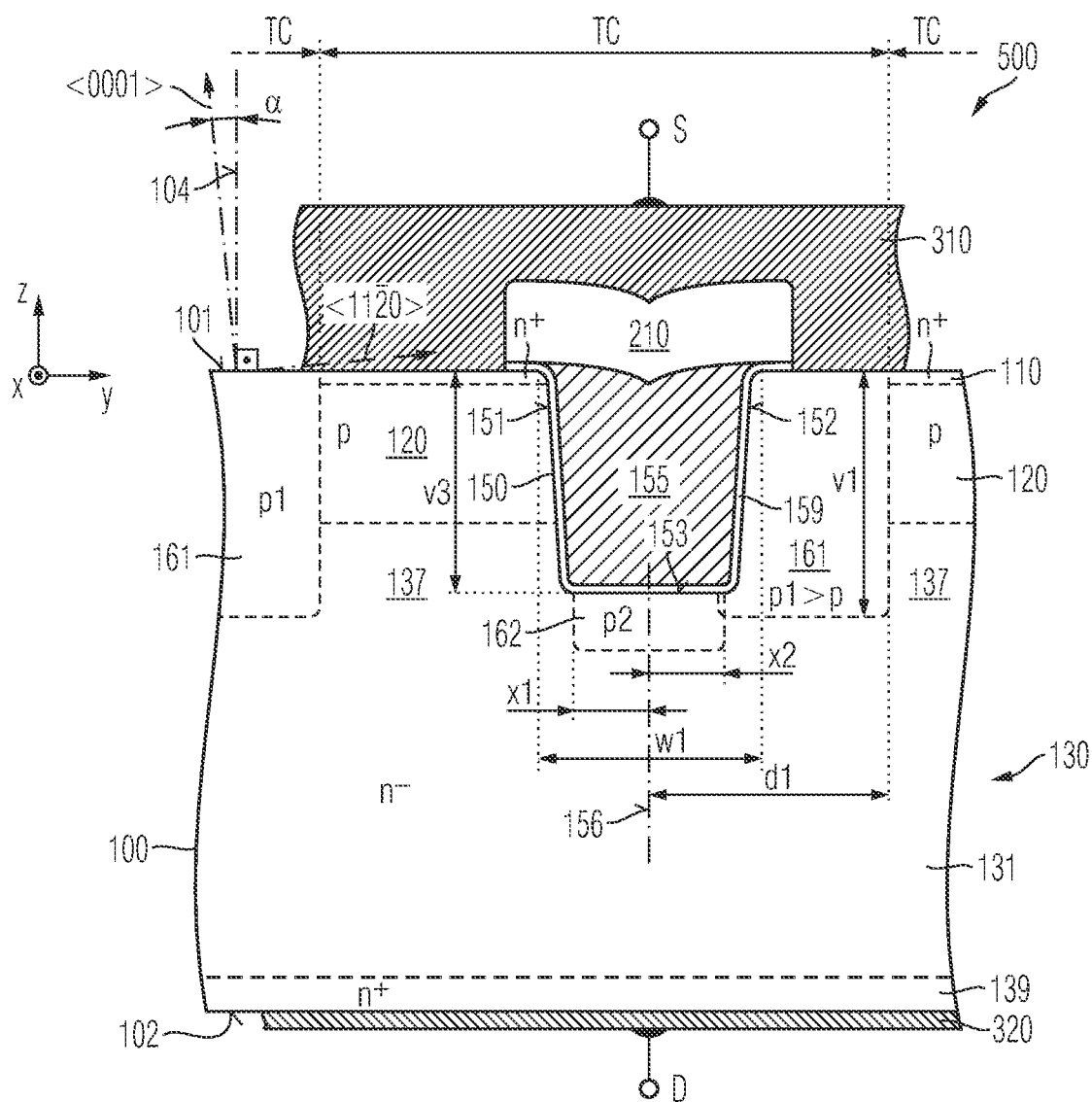
FIG. 6 shows a schematic vertical cross-sectional view of a semiconductor device according to an embodiment with both lateral edges of a buried shielding region below (e.g., directly below) a trench gate structure.

The embodiments to FIGS. 4A to 5 refer to asymmetric spacer masks 420. First implant regions 761 and trenches 450 may be formed in a silicon carbide body 100 as described with reference to FIGS. 1A to 1B, wherein a vertical extension v0 of the trenches 450 may exceed a vertical extension v1 of the top shielding regions 161. In addition, a current spread layer 737 may be formed between the body layer 720 and the drift zone 131. The drift zone 131 and the current spread layer 737 have the same conductivity type. The hard mask is removed. A spacer mask 420 is formed.

Forming the spacer mask 420 may include deposition of an auxiliary mask layer filling the trenches 450 and covering the first surface 101. A first auxiliary mask layer portion that adjoins (e.g., directly adjoins) the second sidewall surface 452 is selectively removed. A residual second auxiliary mask layer portion adjoins (e.g., directly adjoins) and covers the first sidewall surfaces 451 and may completely cover sections of the first surface 101 between the trenches 450.

Deposition of the auxiliary mask layer may include depositing a first sub-layer filling the trench and then depositing a second sub-layer on the first sub-layer and/or on the first surface 101. The first sub-layer may be adapted to completely fill the trench. For example, the first sub-layer may consist of and/or may include TEOS-based silicon oxide. The second sub-layer may be adapted to achieve a sufficiently flat top surface. The second sub-layer may consist of and/or may include a dielectric material with a low glass-transition temperature (e.g., a glass-transition temperature lower than a threshold glass-transition temperature). For example, the second sub-layer may include and/or consist of doped glass(es), e.g. BPSG (boron phosphorous silicate glass). After deposition, a thermal treatment may control a reflow of the second sub-layer to obtain a flat surface. Alternatively or in addition, a chemical mechanical polishing may flatten the exposed surface of the auxiliary mask layer. The auxiliary mask layer is patterned by using a lithography process. The patterned auxiliary mask layer forms a spacer mask 420 with spacer mask openings 425.

FIG. 4A shows the spacer mask 420 with the spacer mask openings 425. The spacer mask openings 425 expose the second sidewall surfaces 452 and sections of the bottom surface 453 adjoining (e.g., directly adjoining) the second sidewall surfaces 452. The spacer mask covers the first sidewall surfaces 451 and sections of the bottom surfaces 453 adjoining (e.g., directly adjoining) the first sidewall surfaces 452. In addition, the spacer mask 420 may completely cover sections of the first surface 101 between the trenches 450.

In addition, FIG. 4A shows the current spread layer 737 between the body layer 720 and the drift zone 131. A mean net dopant concentration in the current spread layer 737 is at least two, at least five, e.g. at least ten times higher than in the drift zone 131.

A stray oxide may be formed in the exposed section of the trench bottom surfaces 453. An implantation beam implants second dopants through the spacer mask openings 425 and, if applicable, through a stray oxide. An implantation beam axis of the implantation beam may be vertical, almost vertical or may be tilted (e.g., significantly tilted) in a plane orthogonal to the cross-sectional plane. The spacer mask 420 is removed. A heat treatment activates the implanted dopants.

For simplicity, FIG. 4B combines the view of the spacer mask 420 with the view of the doped regions obtained by dopant activation. The activated second dopants form a buried shielding region 162 with a first lateral edge towards the first sidewall surface 451 and with a second lateral edge towards the second sidewall surface 452. The first lateral edge is below (e.g., directly below) the trench 450. The second lateral edge is below (e.g., directly below) the top shielding region 161. A connection portion 169 of the buried doped region 162 extends along the second sidewall surface 452. The connection portion 169 connects the top shielding portion 161 with a bottom portion 168 of the buried doped region 162 below the trench 450.

From the current spread layer 737 of FIG. 4A, current spread regions 137 may result that laterally extend between the trenches 450 at one side and the top and buried shielding regions 161, 162 at the opposite side. The current spread regions 137 may extend to below the buried shielding regions 162. Below the buried shielding regions 162, the current spread regions 137 may be laterally connected to form a continuous current spread portion horizontally extending below the buried shielding regions 162.

In the embodiment of FIG. 5 an implantation beam axis of the implantation beam implanting the second dopants may be tilted (e.g., significantly tilted) in the cross-sectional plane at an implant angle β. The implantation beam points away from the first sidewall surface 451 and points into direction of the second sidewall surface 452. After dopant activation, the connection portion 169 of the buried doped region 162 may extend along almost the complete second sidewall surface 452. The connection portion 169 and the top shielding region 161 overlap along the second sidewall surface 452.

FIGS. 1A-1G, 2, 3, 4A-4B, and 5 show exemplary embodiments of methods of manufacturing a semiconductor device. The semiconductor device may be a semiconductor device as described herein, such as in connection with the embodiments shown in FIGS. 6, 7, 8A-8B, 9 and 10. Vice versa, a semiconductor device described in the following figures may be manufactured with a method as described in connection with the embodiments of FIGS. 1A-1G, 2, 3, 4A-4B, and 5.

FIGS. 6 to 10 show semiconductor devices 500 with a silicon carbide body 100. Each semiconductor device 500 may be and/or may include an IGFET (insulated gate field effect transistor), for example an MOSFET (metal oxide semiconductor FET), an MCD (MOS controlled diode) an IGBT (insulated gate bipolar transistor), by way of example.

The silicon carbide body 100 may include and/or consist of single crystalline silicon carbide, e.g., a silicon carbide crystal including the main constituents silicon and carbon. The silicon carbide crystal may include dopant atoms and further impurities like hydrogen and/or oxygen. The polytype of the silicon carbide crystal may be 15R or may be a hexagonal polytype, e.g. 2H, 6H, or 4H. The silicon carbide body 100 may include and/or consist of a silicon carbide layer grown by epitaxy.

The silicon carbide body 100 may have an off-direction, for example in a <11-20> or a <1-100> direction. A first surface 101 at a front side of the silicon carbide body 100 may be planar or ripped. Opposite to the front side, a second surface 102 of the silicon carbide body 100 may extend parallel to a planar first surface 101 or parallel to a mean plane of a ripped first surface 101.

A surface normal orthogonal to a planar first surface 101 or orthogonal to a mean plane of a ripped first surface 101 defines a vertical direction. Directions orthogonal to the surface normal are lateral directions (e.g., the first and the second direction). The surface normal may coincide with a main lattice direction. In the illustrated example, the c-axis (<0001> lattice direction) is tilted to the surface normal at an off-axis angle α in the plane spanned by the x-axis and the y-axis. The off-axis angle α may be in a range from 2° to 8°. For example, the off-axis angle α may be 4° or approximately 4°.

Transistor cells TC are formed at the front side of the silicon carbide body 100. A drain/drift structure 130 laterally extends through the silicon carbide body 100 between the transistor cells TC and the second surface 102.

Each transistor cell TC includes a source region 110 and a body region 120. The source region 110 is between the first surface 101 and the body region 120. The source region 110 has a first conductivity type and the body region 120 has a complementary second conductivity type. The body region 120 is between the source region 110 and the drain/drift structure 130. The body region 120 and the drain/drift structure 130 form a first pn junction. The body region 120 and the source region 110 form a second pn junction.

A trench gate structure 150 extends from the first surface 101 into the silicon carbide body 100. The trench gate structure 150 has a length along the x-axis and a width w1 along the y-axis, wherein the width w1 is measured in the plane of the first surface 101. The width w1 may be in a range from 500 nm to 2 μm. A vertical extension v3 of the trench gate structure 150 may be in a range from 500 nm to 2 μm. The trench gate structure 150 includes a conductive gate electrode 155 and a gate dielectric 159. The gate dielectric 159 separates the gate electrode 155 and the silicon carbide body 100.

An interlayer dielectric 210 covers the gate electrode 155 in a cell array region that includes the transistor cells TC. In a peripheral region without transistor cells TC, gate contacts may electrically couple or connect the gate electrodes 155 with a gate pad/wiring structure formed on the first surface 101.

The trench gate structure 150 has an active first sidewall 151, which is in contact with the source region 110 and in contact with the body region 120. The first sidewall 151 may be parallel to the (11-20) lattice planes of the silicon carbide crystal.

A top shielding region 161 extends along an inactive second sidewall 152 of the trench gate structure 150. The top shielding region 161 has the second conductivity type. The top shielding region 161 of a first transistor cell TC may laterally adjoin (e.g., directly adjoin) the source region 110 and the body region 120 of a neighboring second transistor cell TC. The top shielding region 161 has the conductivity type of the body regions 120. At least along the first surface 101, a dopant concentration in the top shielding region 161 is higher than in the body region 120. The dopant concentration in the top shielding region 161 may be sufficiently high such that no inversion layer is formed along the second sidewall 152 at least as long as the semiconductor device 500 operates within the SOA. A vertical extension v1 of the top shielding region 161 may exceed a vertical extension v3 of the trench gate structure 150.

A first load electrode 310 may be electrically coupled to or connected with the source regions 110 and the top shielding regions 161 in the cell array region. The first load electrode 310 may form or may be electrically connected or coupled to a first load terminal.

The drain/drift structure 130 includes a drift zone 131 of the first conductivity type. The drift zone 131 forms a voltage sustaining structure, wherein a vertical extension and a dopant concentration in the drift zone 131 may be selected such that the semiconductor device 500 provides a predefined nominal blocking voltage capability in an off-state of the semiconductor device 500. The drift zone 131 may be formed in a layer grown by epitaxy. A mean net dopant concentration in the drift zone 131 may be, for example, in a range from 1E15 cm-3 to 5E16 cm-3. ($1\times10^{15}$ $cm^{-3}$ to $5\times10^{16}$ $cm^{-3}$)

The drain/drift structure 130 includes a heavily doped contact portion 139. The contact portion 139 is formed between the drain/drift structure 130 and a second load electrode 320 that adjoins (e.g., directly adjoins) the second surface 102. The heavily doped contact portion 139 and the second load electrode 320 form a low-resistive ohmic contact (e.g., an ohmic contact having a resistivity lower than a threshold resistivity). The contact portion 139 may have the same conductivity type as the drift zone 131, the opposite conductivity type, or may include zones of both conductivity types. The second load electrode 320 may form or may be electrically connected or coupled to a second load terminal.

The first load terminal may be an anode terminal of an MCD, a source terminal S of an MOSFET or an emitter terminal of an IGBT. The second load terminal may be a cathode terminal of an MCD, a drain terminal D of an MOSFET or a collector terminal of an IGBT, by way of example.

The transistor cells TC may be n-channel FET cells with p-doped body regions 120, n-doped source regions 110 and n-doped drift zone 131. Alternatively, the transistor cells TC are p-channel FET cells with n-doped body regions 120, p-doped source regions 110 and p-doped drift zone 131. As a mere example, the following description refers to n-channel FET cells.

A buried shielding region 162 extends along a bottom area 153 of the trench gate structure 150. The buried shielding region 162 and the top shielding region 161 are structurally and electrically connected (e.g., directly structurally and electrically connected). The buried shielding region 162 has a first lateral edge oriented to the first sidewall 151 and a second lateral edge oriented to the second sidewall 152. The first lateral edge is below (e.g., directly below) the trench gate structure 150. The second lateral edge is below (e.g., directly below) the trench gate structure 150 and/or below (e.g., directly below) the top shielding region.

A first lateral extension x1 between a vertical longitudinal center plane 156 of the trench gate structure 150 and the first lateral edge of the buried shielding region 162 may be equal to or smaller than a second lateral extension x2 between the vertical longitudinal center plane 156 and the second lateral edge.

The second lateral extension x2 between the vertical longitudinal center plane 156 and the second lateral edge may be smaller than a distance dl between the vertical longitudinal center plane 156 and a distant edge of the top shielding region 162 at the first surface 101, wherein the distant edge of the top shielding region 161 is averted from the trench gate structure 150. For example, the second lateral extension x2 may be at most 80%, at most 65% or at most 60% of the distance dl. According to another example, the second lateral extension x2 between the vertical longitudinal center plane 156 and the second lateral edge of the buried shielding region 162 may be equal to or smaller than half of the width w1 of the trench gate structure 150 at the first surface 101.

The top shielding region 161 and the buried shielding region 162 are electrically connected. The top shielding region 161 and the buried shielding region 162 may also be structurally connected. For example, the buried shielding region 162 is in contact (e.g., direct contact) with the top shielding region 161.

Figure 7:
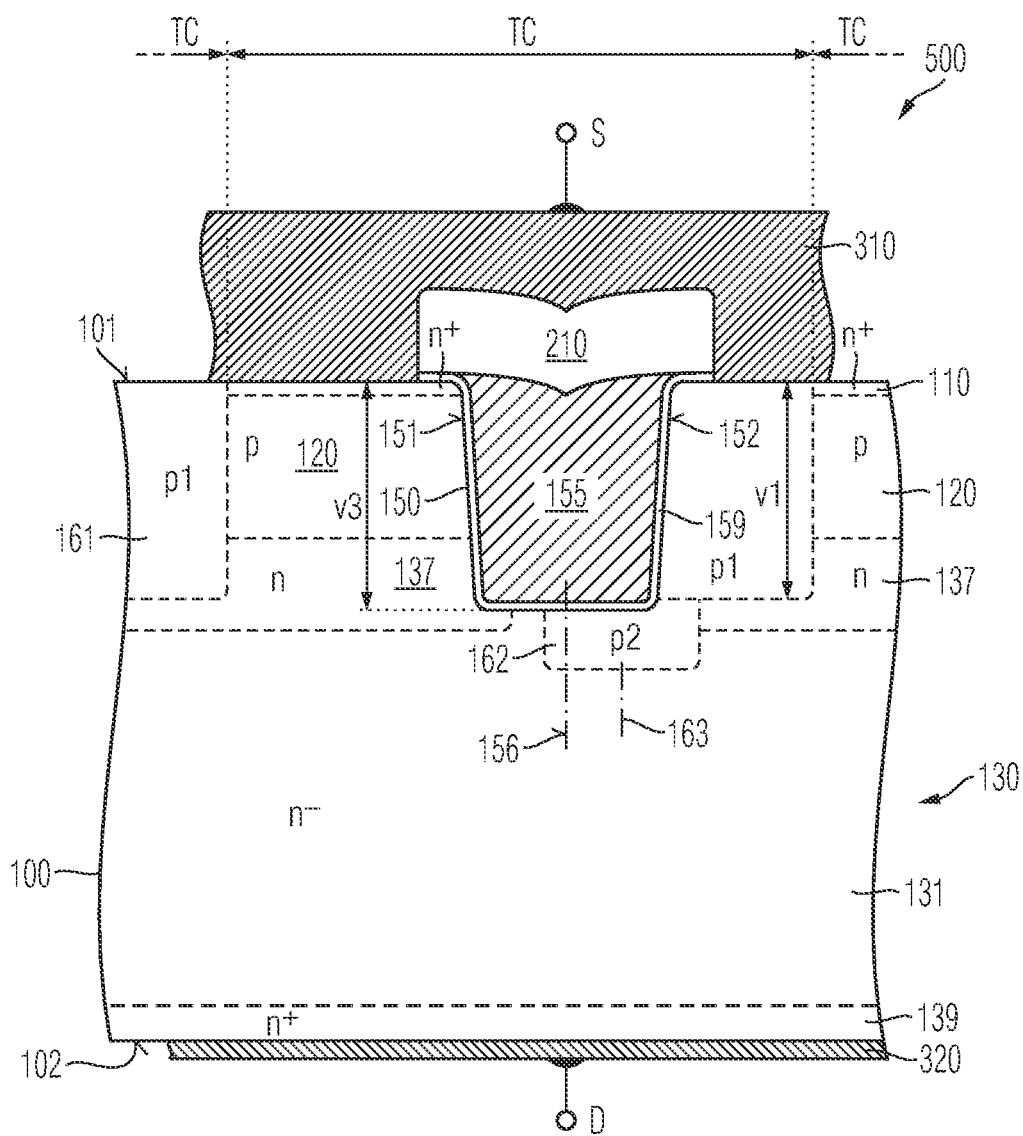
FIG. 7 shows a schematic vertical cross-sectional view of a semiconductor device according to an embodiment with a first lateral edge of a buried shielding region below (e.g., directly below) a trench gate structure and a second lateral edge below (e.g., directly) below a top shielding region.
Figure 8:
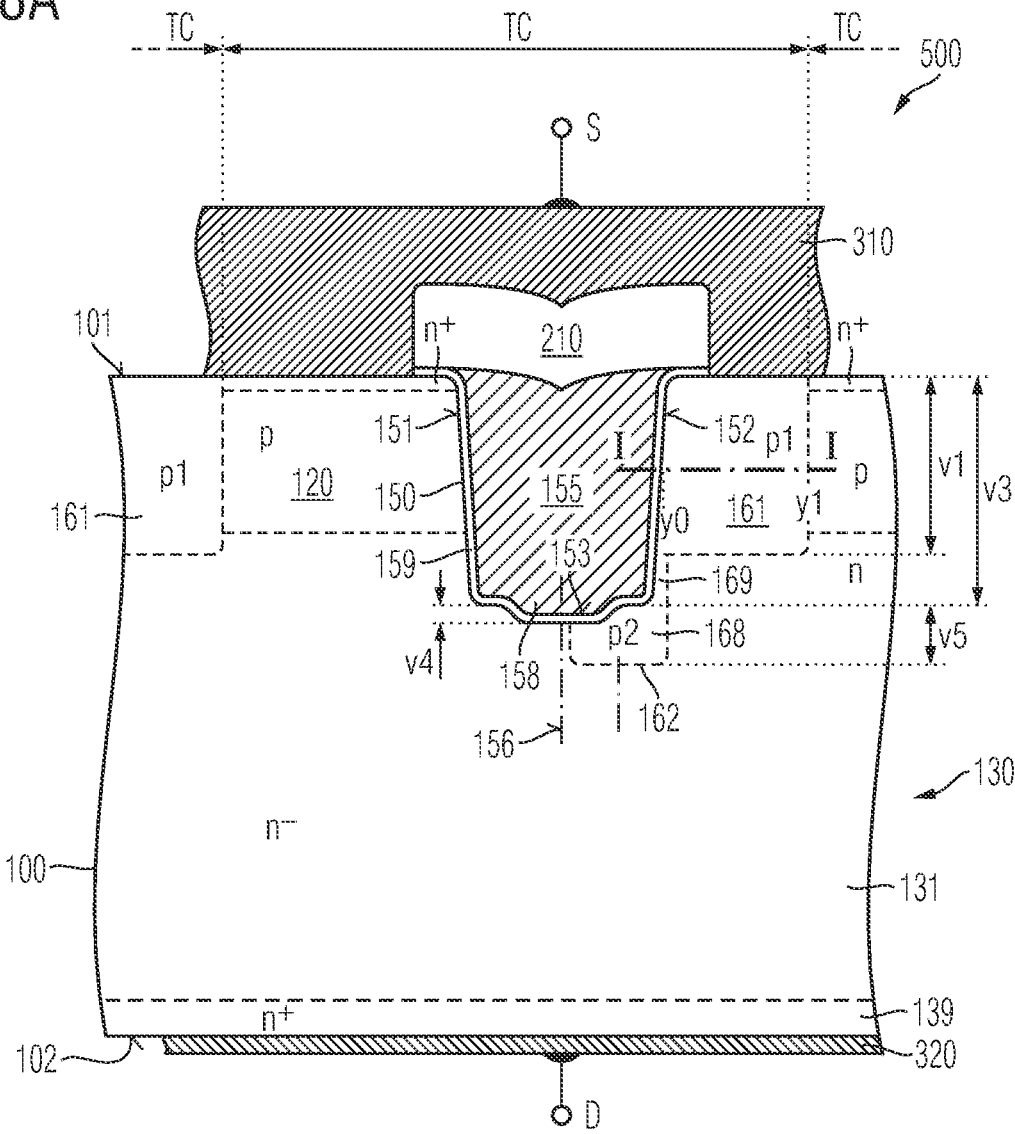
FIGS. 8A-8B show a schematic vertical cross-sectional view of a semiconductor device and a schematic lateral dopant distribution diagram according to an embodiment with a top shielding region having a lower vertical extension than a trench gate structure.

The semiconductor device 500 of FIG. 7 includes an asymmetric buried shielding region 162. A vertical longitudinal center plane 163 of the buried shielding region 162 is between the vertical longitudinal center plane 156 of the trench gate structure 150 and the second sidewall 152. A vertical extension v1 of the top shielding region 161 may be equal to or smaller than the vertical extension v3 of the trench gate structure 150.

A current spread region 137 with the conductivity type of the drift zone 131 laterally extends between neighboring buried shielding regions 162. A mean dopant concentration in the current spread regions 137 is at least twice, at least five times, e.g. at least ten times as high as in the drift zone 131.

FIG. 8A shows a semiconductor device 500 with a local recess portion 158 in the center of the bottom area 153. A vertical extension v4 of the recess portion 158 may be in a range from 0 nm to 200 nm. The recess portion 158 may be combined, for example, with the buried shielding regions 162 according to the embodiments of FIG. 6, FIG. 7 and FIG. 9.

The buried shielding region 162 may include a bottom portion 168 below the bottom area 153 and a connection portion 169 extending along the second sidewall 152 at least from the top shielding region 161 to the bottom portion 168. A vertical extension v5 of the bottom portion 168 may be in a range from 200 nm to 2000 nm.

As illustrated in FIG. 8B, the connection portion 169 and the top shielding region 161 may overlap along the second sidewall 152. A maximum dopant concentration NA3 at the second sidewall 152 may be at least 1E18 $cm^{-3}$ ($1 \times 10^{18}$ $cm^{-3}$) higher than a dopant concentration NA2 in a lateral center of the top shielding region 161 in the same horizontal plane, e.g. in a plane at the half vertical extension v1.

Figure 9:
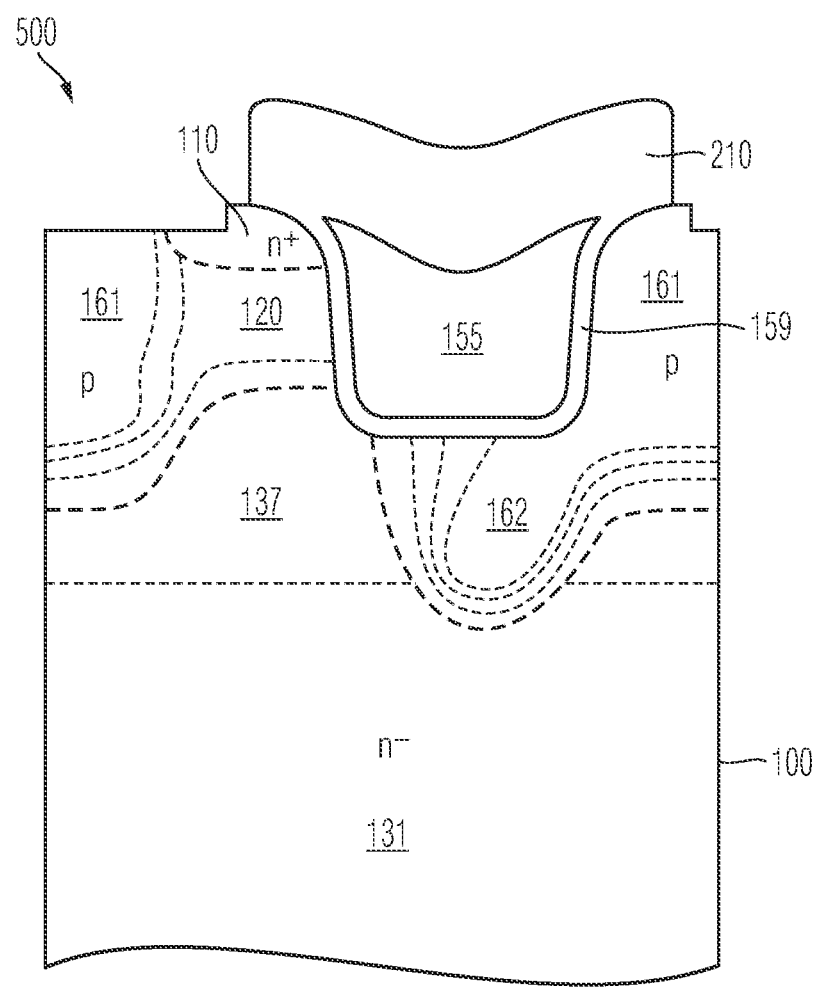
FIGS. 9-10 show schematic vertical cross-sectional views of a silicon carbide device according to further embodiments.
Figure 10:
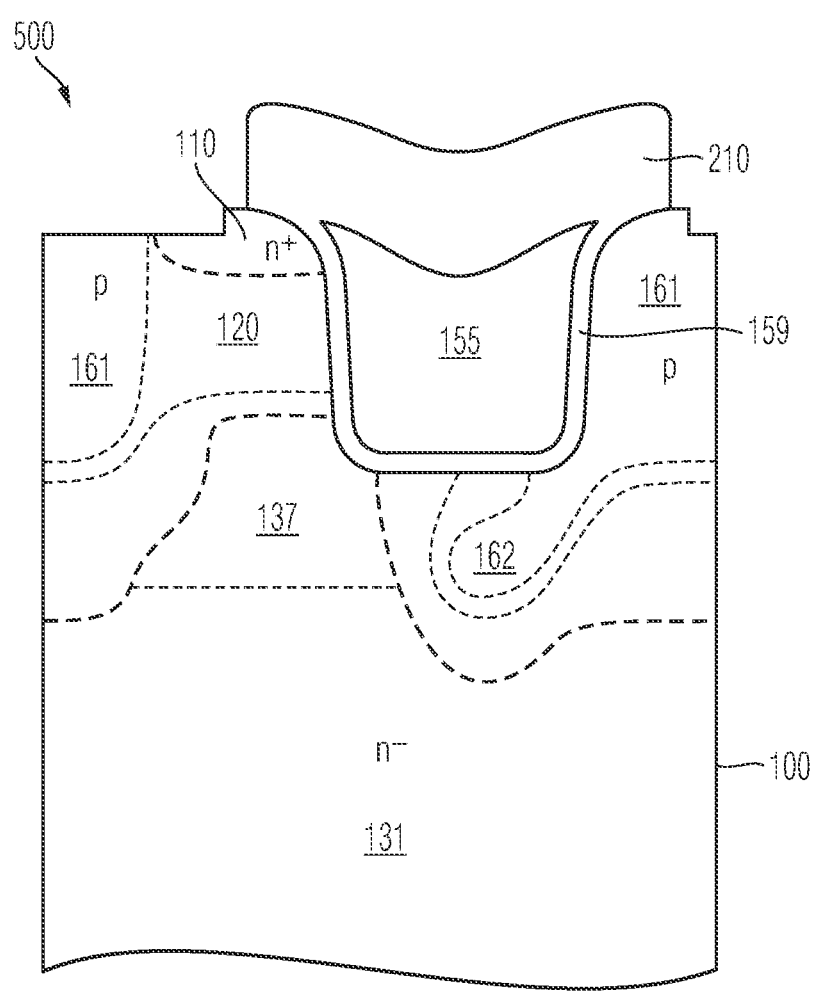

FIGS. 9 and 10 show further embodiments of a transistor cell TC with asymmetric buried shielding region 162. At the inactive side, the buried shielding region 162 and the top shielding region 161 are reliably connected. At the active side, the buried shielding region 162 does not extend or only to a low degree extends to below the body region 120.

What is claimed is:

1. A method of manufacturing a semiconductor device, the method comprising:
    implanting first dopants through a first surface section, exposed by an implant mask opening, of a first surface of a silicon carbide body;
    forming a trench extending from the first surface, through which the first dopants were implanted, into the silicon carbide body, wherein the trench comprises a first sidewall surface and an opposite second sidewall surface;
    forming a spacer mask covering at least the first sidewall surface;
    implanting second dopants through a portion of a bottom surface of the trench exposed by the spacer mask, wherein the first dopants and the second dopants have a same conductivity type;
    activating the first dopants and the second dopants, wherein:
        the first dopants form at least one of a doped top shielding region adjoining the second sidewall surface or a body region adjoining at least the first sidewall surface; and
        the second dopants form a doped buried shielding region adjoining the bottom surface; and
    forming a gate electrode between the first sidewall surface and the second sidewall surface adjoining the doped top shielding region.

2. The method according to claim 1, wherein:
    in a direction from the first sidewall surface to the second sidewall surface, the doped buried shielding region ends at least one of below the trench or below the doped top shielding region.

3. The method according to claim 1, wherein:
    a lateral center of the doped buried shielding region is between a lateral center of the trench and the second sidewall surface.

4. The method according to claim 1, wherein:
    at least a portion of the second dopants are implanted with an implantation beam axis tilted with respect to a vertical direction at an implant angle in a vertical plane orthogonal to a horizontal longitudinal extension of the trench; and
    the implantation beam axis is directed to the second sidewall surface.

5. The method according to claim 1, wherein:
    forming the trench comprises:
        forming a hard mask on the first surface, the hard mask comprising a hard mask opening exposing a second surface section of the first surface; and
        forming the trench using the hard mask as etch mask; and
    forming the spacer mask comprises:
        forming a mask layer covering the first sidewall surface, the second sidewall surface and the bottom surface; and
        selectively removing horizontal layer portions of the mask layer, wherein the hard mask and remaining vertical layer portions of the mask layer form the spacer mask.

6. The method according to claim 1, wherein:
    forming the spacer mask comprises exposing and recessing a portion of the bottom surface of the trench.

7. The method according to claim 1, wherein forming the spacer mask comprises:
    forming an auxiliary mask layer filling the trench and covering the first surface, and
    selectively removing a first auxiliary mask layer portion that adjoins the second sidewall surface, wherein a residual second auxiliary mask layer portion covering at least the first sidewall surface forms the spacer mask.

8. The method according to claim 1, comprising:
    forming a stray oxide in an exposed section of the bottom surface.

9. The method according to claim 1, wherein:
    the spacer mask covers at least some of the second sidewall surface.

10. The method according to claim 1, wherein:
    the doped top shielding region adjoins a majority of a portion of the second sidewall surface adjoining the silicon carbide body.

11. The method according to claim 1, wherein:
    the first dopants form the doped top shielding region adjoining the second sidewall surface.

12. The method according to claim 1, wherein:
    the first dopants form the body region adjoining at least the first sidewall surface.

13. A method of manufacturing a semiconductor device, the method comprising:
    implanting first dopants through a first surface section, exposed by an implant mask opening, of a first surface of a silicon carbide body;
    forming a trench extending from the first surface, through which the first dopants were implanted, into the silicon carbide body, wherein the trench comprises a first sidewall surface and an opposite second sidewall surface;
    forming a spacer mask covering at least the first sidewall surface;

implanting second dopants through a portion of a bottom surface of the trench exposed by the spacer mask, wherein the first dopants and the second dopants have a same conductivity type; and activating the first dopants and the second dopants, wherein:

the first dopants form at least one of a doped top shielding region adjoining the second sidewall surface or a body region adjoining at least the first sidewall surface; and the second dopants form a doped buried shielding region adjoining the bottom surface, wherein:

at least a portion of the second dopants are implanted with an implantation beam axis tilted with respect to a vertical direction at an implant angle in a vertical plane orthogonal to a horizontal longitudinal extension of the trench; and the implantation beam axis is directed to the second sidewall surface.

14. The method according to claim 13, wherein:

forming the spacer mask comprises:

forming an auxiliary mask layer filling the trench and covering the first surface; and selectively removing a first auxiliary mask layer portion that adjoins the second sidewall surface, wherein a residual second auxiliary mask layer portion covering at least the first sidewall surface forms the spacer mask.

15. The method according to claim 13, comprising:

forming a stray oxide in an exposed section of the bottom surface.

16. The method according to claim 13, wherein:

the spacer mask covers at least some of the second sidewall surface.

17. A method of manufacturing a semiconductor device, the method comprising:

implanting first dopants through a first surface section, exposed by an implant mask opening, of a first surface of a silicon carbide body;

forming a trench extending from the first surface, through which the first dopants were implanted, into the silicon carbide body, wherein the trench comprises a first sidewall surface and an opposite second sidewall surface;

forming a spacer mask covering at least the first sidewall surface;

implanting second dopants through a portion of a bottom surface of the trench exposed by the spacer mask, wherein the first dopants and the second dopants have a same conductivity type; and activating the first dopants and the second dopants, wherein:

the first dopants form at least one of a doped top shielding region adjoining the second sidewall surface or a body region adjoining at least the first sidewall surface; and the second dopants form a doped buried shielding region adjoining the bottom surface, wherein forming the spacer mask comprises exposing and recessing a portion of the bottom surface of the trench.

18. The method according to claim 17, wherein:

forming the spacer mask comprises:

forming an auxiliary mask layer filling the trench and covering the first surface; and selectively removing a first auxiliary mask layer portion that adjoins the second sidewall surface, wherein a residual second auxiliary mask layer portion covering at least the first sidewall surface forms the spacer mask.

19. The method according to claim 17, comprising:

forming a stray oxide in an exposed section of the bottom surface.

20. The method according to claim 17, wherein:

the spacer mask covers at least some of the second sidewall surface.

* * * * *